United States Patent [19]

Yan

[11] Patent Number: 4,950,929

[45] Date of Patent: Aug. 21, 1990

[54] REDUCING RESISTIVE EFFECTS OF AN ELECTRICAL SWITCH

[75] Inventor: Raymond Chan-Man Yan, Daly City, Calif.

[73] Assignee: Teledyne Industries, Mountain View, Calif.

[21] Appl. No.: 178,566

[22] Filed: Apr. 7, 1988

[51] Int. Cl.⁵ .......................... H03F 1/26; H03B 1/04
[52] U.S. Cl. ................................ 307/491; 307/542; 307/550; 328/127; 328/162; 328/151; 330/9
[58] Field of Search ............... 307/490, 491, 492, 497, 307/542, 550; 328/127, 162, 165, 151; 330/9, 253

[56] References Cited

U.S. PATENT DOCUMENTS

| | | | |
|---|---|---|---|
| 3,723,907 | 3/1973 | Tajchman et al. | 328/127 |
| 3,735,274 | 5/1973 | Nelson | 330/9 |
| 4,306,196 | 12/1981 | Dwarakanath et al. | 330/9 |
| 4,323,798 | 4/1982 | Watkins | 307/491 |
| 4,651,032 | 3/1987 | Nobuta | 328/127 |
| 4,710,726 | 12/1987 | Czarnul | 328/127 |

Primary Examiner—Timothy P. Callahan
Attorney, Agent, or Firm—Fliesler, Dubb, Meyer & Lovejoy

[57] ABSTRACT

An electrical switch network having a substantially reduced effective ON-resistance is provided. The electrical switch network includes an input amplifier receiving the input signal at one input, and a first switch having a first terminal connected to the output of the input amplifier and a second terminal connected to a device, such as an integrator circuit, which is to receive the amplified input signal. Two additional switches are connected between a respective terminal of the first switch and a second input of the input amplifier. A pulse signal generator controls the conductive state of the switches such that the first and third switches are in a complementary conductive state with respect to the second switch. The conductive resistance of the second switch is preferably chosen to be equal to or greater than the combined conductive resistance of the first and third switches.

11 Claims, 2 Drawing Sheets

REDUCING RESISTIVE EFFECTS OF AN ELECTRICAL SWITCH

CROSS-REFERENCE TO RELATED APPLICATION

U.S. patent application Ser. No. 178,530, now abandoned, entitled "Offset-Compensated Amplifier", filed on the same day as the present invention and invented by the same inventor of the present application, and owned currently and at the time of invention by a common assignee, is incorporated by reference.

FIELD OF THE INVENTION

This present invention relates generally to an electrical switch for selectively coupling and decoupling an electrical source signal to an instrument. More specifically, the present invention relates to means and method for substantially reducing the resistive effect of an electrical switch.

BACKGROUND OF THE INVENTION

In applying an electrical signal to an instrument, it is often advantageous to insert a switch between the signal and the instrument, so that the two can be selectvely coupled and decoupled, for example, during the transient periods of the signal, such as its initial slewing and settling periods.

However, most electrical switches have an inherent resistive effect in their "on" state (hereinafter called the ON-resistance, $R_{on}$). The ON-resistance of a switch moreover varies in accordance with the voltage level of the applied signal, which, in most applications, may further interfere with the proper operation of an instrument. For example, in "A New Single-Chip $C^2MOS$ A/D Convertor For Microprocessor Systems—Penta-Phase Integrating $C^2MOS$ A/D Convertor", IEEE Journal of Solid State Circuits, Vol. SC-13, No. 6, Dec. 1978, page 781, there is disclosed that the ON-resistance of a switch would reduce the conversion accuracy of an A/D convertor.

To further illustrate the undesirability of the ON-resistance of a switch, consider the conventional integrator circuit 1 of FIG. 1. In the circuit, an input signal is coupled to a standard integrator 12 by way of a switch 11 so the transients of the input signal can be avoided.

In the ideal case, the output, $V_{out}$, of an integrator circuit should preferably be equal to:

$$V_{out} = -(1/R_{int}C_{int})\int V_{in}dt$$

where $R_{int}$ = resistance of integrating resister 13, $C_{int}$ = capacitance of integrating capacitor 12.

The time constant, $t_c$, of the integrator 12 should equal to $R_{int}C_{int}$. Such an ideal case is usually not attainable in the circuit 10 of FIG. 1. Instead, because of the ON-resistance of the switch 11, the time constant of the circuit 10 becomes $t'_c[R_{int}+R_{on}]C_{int}$. The operation of the integrator 12 may degrade further if the ON-resistance of the switch $R_{on}$ changes further changes in accordance with the level of the input voltages, $V_{in}$.

A conventional method of reducing the resistive effect of switch 11 is to use a resistor $R_{int}$ having resistance much higher than the ON-resistance $R_{on}$ as the integrating resistor. In this way $R_{on}$ becomes negligible (i.e. $R_{int} >> R_{on}$, and $R_{int}+R_{on} \approx R_{int}$), so that $t'_c = (R_{int}+R_{on})C_{int} \approx R_{int}C_{int}$.

However, making the resistor $R_{int}$ too large may pose another problem. In applications such as analog-to-digital (A/D) converters, the $R_{int}C_{int}$ time constant must be kept small to provide fast integration. On the other hand, $C_{int}$ must be kept relatively large so that the A/D converter can operate accurately. As a result, $R_{int}$ should preferably have a small value. Hence, the use of a large $R_{int}$ is not usually desirable, and there exits a need for an electrical switch that has little ON-resistance.

SUMMARY OF THE INVENTION

In one aspect, the present invention is a circuit for selectively coupling and decoupling an electrical source signal to a device. The circuit includes a differential input amplifier having a noninverting input receiving the electrical signal source and a first switch connected between the an noninverted output of the amplifier and the device. The noninverted output of the amplifier is connected to a first side of the first switch and the device being connected at a second side of the first switch. A second switch is connected between an inverting input of the amplifier and said first side of said first switch. A third switch is connected between the inverting input of the amplifier and the second side of the first switch.

In another aspect, this invention provides a method for selectively coupling and decoupling a source signal to a device. The method includes the steps of applying a source signal to a noninverting input of a differential input amplifier having a predetermined gain, connecting a first side of an electrical switch to a noninverted output of the differential input amplifier and connecting a second side of the electrical switch to the device. The first side of the electrical switch is then connected to an inverting input of the differential amplifier when the electrical switch is open. The second side of the electrical switch is connected to the inverting input of the differential amplifier when the electrical switch is closed.

Advantageously, the circuit and the method according to the present invention allow selective coupling and decoupling of a signal source to a device with small substantive resistive effect.

DESCRIPTION OF THE PREFERRED EMBODIMENT

Figure 1:
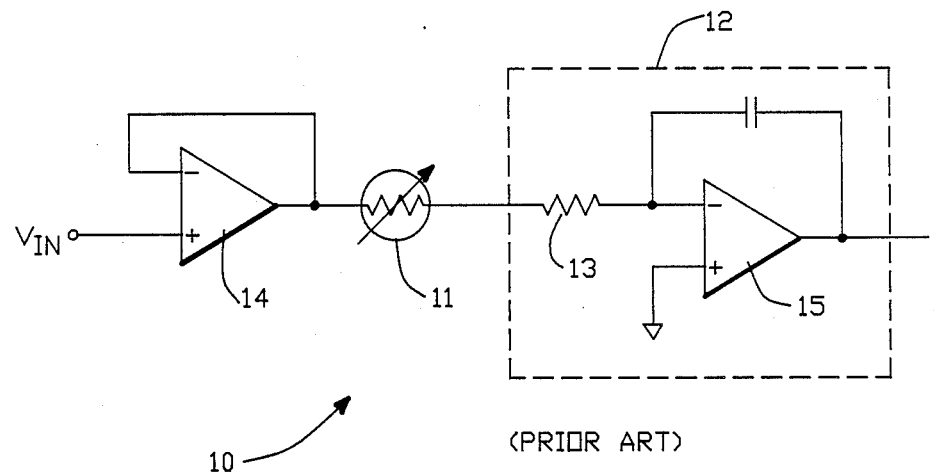
FIG. 1 is a schematic diagram illustrating a prior art circuit configuration for reducing the resistive effect of a switch.
Figure 2:
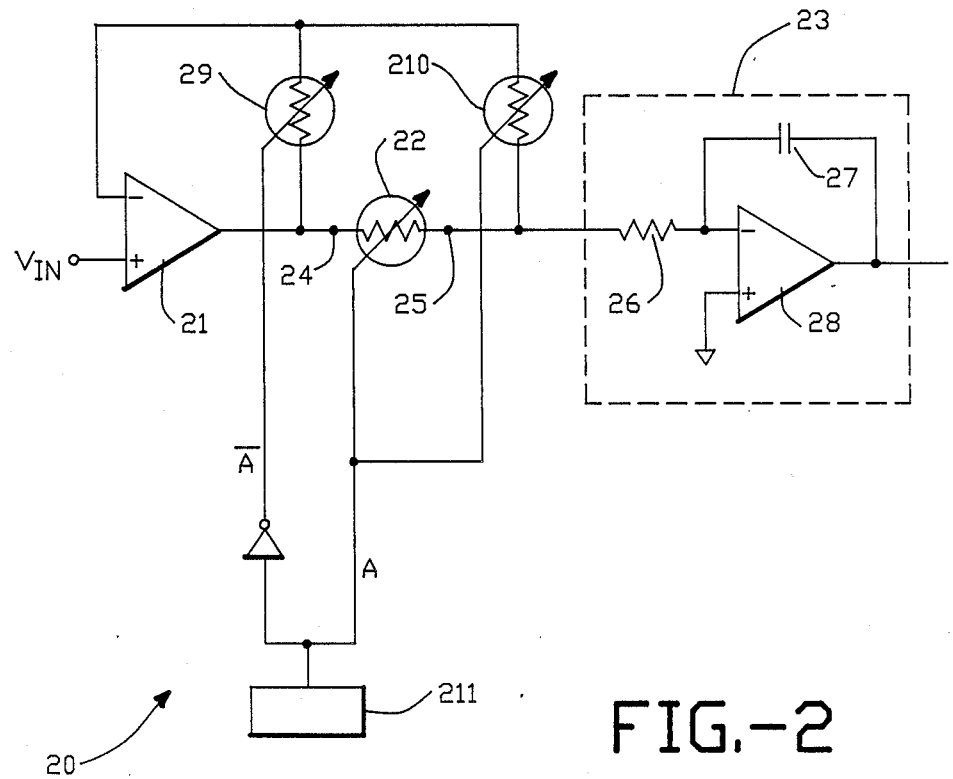
FIG. 2 is a schematic diagram illustrating a preferred embodiment of the present invention.

FIG. 2 illustrates an integrator circuit 20 for integrating a source signal, $V_{in}$, and wherein the present invention is embodied. The circuit 20 comprises a MOS (metal oxide semiconductor) differential input amplifier 21, such as an operational amplifier, and an integrator 23. The circuit 20 has a first switch 22 whereby the source signal, $V_{in}$, can be selectively coupled and decoupled to the integrator 23 for bypassing the transients of the signal. The circuit 20 further includes a second and a third switches 29 and 210 coupled to the amplifier 21 and the first switch 22 for substantially reducing the resistive effect of the switch 22. The integrator 23 is a conventional circuit which comprises a resistor 26, a capacitor 27 and a differential amplifier 15. The amplifier 21 is used as a buffer for the source signal, $V_{in}$. However, in accordance with this preferred embodiment, the amplifier 21 also forms part of the circuit for reducing the resistive effect of the first switch 22.

Since any input voltage offset from the amplifier 21 will appear as a time dependent function at the output of the circuit 20, further enhancement of the circuit may be accomplished if the differential input amplifier 21 is provided means for adjusting its quiescent output voltage. One such amplifier, with means for adjusting the quiescent output voltage, is disclosed by the present inventor in the above identified cross-referenced application.

The source signal, $V_{in}$, is applied to the noninverting input of the amplifier 21. The noninverted output of the amplifier 21 is connected to a first side 24 of the first switch 22. The second side 25 of the first switch 22 is connected to the input of the integrator 23.

Connected between the first side 24 of the first switch 22 and the inverting input of the amplifier 21 is a second switch 29. Connected between the second side 25 of the switch 22 and the inverting input of the differential input amplifier 21 is a third switch 210.

Each of the first switch 22 and the third switch 210 is controlled by a digital siganl A such that they both open and close at substantially the same time. On the other hand, the second switch 29 is controlled by a digital signal, $\overline{A}$, having an opposite phase as the digital signal A such that when the first switch 22 and the third switch 210 are opened, the second switch 29 will close, and when the first switch 22 and third switch 210 are closed, the second switch will open.

Figure 3:
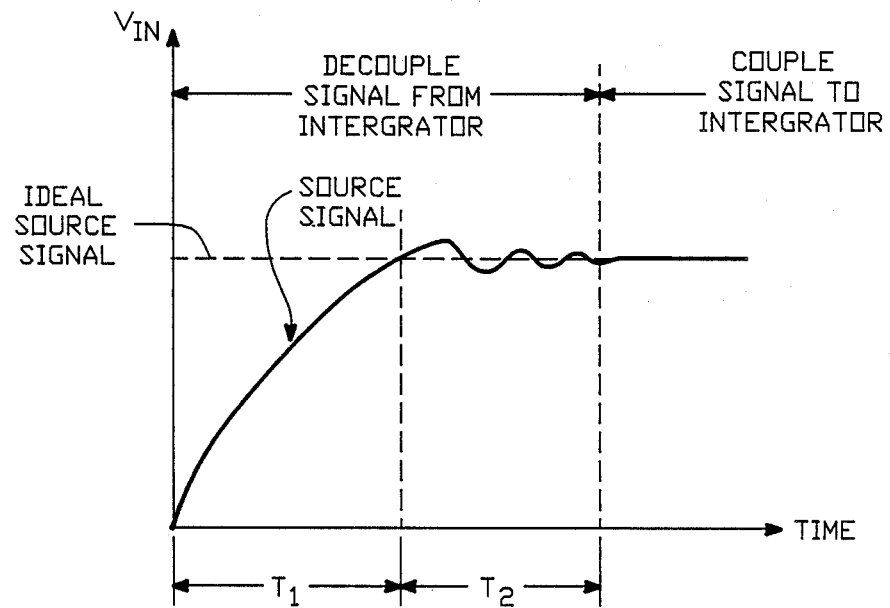
FIG. 3 is a timing diagram showing the typical transient characteristics of an electrical signal.

FIG. 3 is a timing diagram illustrating the typical transients at the output of amplifier 21. During the time period $T_1$, the signal at the output of the amplifier 21 undergoes a slewing period. During the time period $T_2$, the signal at the output of amplifier 21 undergoes a settling period. Although the transients at the output of the amplifier 21 may be caused by the signal source, $V_{in}$, as well as the transient characteristics of the amplifier 21 itself, the transients of the signal source, $V_{in}$, are usually filtered by the amplifier 21, so that the transients of the amplifier 21 would constitute the main source of inaccuracies in the circuit 20.

To achieve proper operation of the circuit 20, it is desirable to decouple the amplifier 21 and the integrator 23 for the period, $T_1+T_2$, and to recouple them thereafter. Accordingly, pulses A and $\overline{A}$, both with a period T greater or equal to $T_1+T_2$, is first applied to the switches 22, 29 and 210, so that during the period T, the second switch 29 will close and the first and third switches 22, 210 will both open. As a result, the amplifier 21 is connected in a series-shunt feedback configuration by switch 29. In this configuration, the amplifier 21 operates as a buffer, such that the inverting terminal of differential amplifier 21 and node 24 have the same potential. Furthermore, because amplifier 21 is a MOS amplifier no substantial DC current will flow into the inverting input terminal thereof. Typically, the ON-resistance of the switches 29 and 210 are small enough so that they do not degrade the stability of the amplifier 21. With switch 29 turned on, and switches 22 and 210 turned off, the transients at the output of amplifier 21 will not be transmitted to the integrator 23. But node 24 at the output of amplifier 21 will come up, through the transient periods $T_1$ and $T_2$, and settle at $V_{in}$.

After the time period T, both A and $\overline{A}$ are inverted, so that the second switch 29 is now opened, and the first and the third switches 22 and 210 are closed. In this manner, the first switch 22 connects the output of amplifier 21 to the integrator 23 while the third switch 210 connects point 25 back to the inverting input of amplifier 21. Again a series-shunt feedback configuration is formed and the amplifier 21 still operates as a buffer. Because both the output of amplifier 21 and node 24 have already settled to potential $V_{in}$, node 25 will not experience any transients, and will quickly settle to the potential $V_{in}$.

The above-mentioned pulse signal that controls the switches can be generated by any conventional one-shot circuit 211. The time period T of this signal can be preset, depending upon the transient time periods $T_1$ and $T_2$ of the source signal.

As an illustrative example, each of the switches 22, 29, 210 may be constructed by a combination of an n-channel MOS transistor and a p-channel MOS transistor, with the drain of the n-channel transistor connected to the source of the p-channel transistor, and with the source of the n-channel transistor connected to the drain the p-channel transistor. The gate of n-channel transistor is driven by the corresponding control signal, A or $\overline{A}$, and the gate of p-channel is driven by the opposite phase of said corresponding control signal, $\overline{A}$ or A. Exemplary transistor channel dimensions for the switches 22, 29, 210 may be:

TABLE 1

| Switch 29 | $(W/L)_n = 50\mu/12\mu$ |
|---|---|
| | $(W/L)_p = 50\mu/9\mu$ |
| so that | $R_{on} = 1.6\ K\Omega$ |
| Switches 22, 210 | $(W/L)_n = 200\mu/12\mu$ |
| | $(W/L)_p = 200\mu/9\mu$ |
| so that | $R_{on} = 400\ \Omega$ |
| where | $1\mu = 1$ micrometer |

If the open loop gain of amplifier is 10,000, one skilled in the art will understand that the effective resistance, $R_{eff}$, experienced by the signal will be $(R_{on})/(1+A)$, where A is the open-loop gain of the amplifier 21. In the above illustrative example:

$$R_{eff} = R_{on(22)}/(1+A) = 400\Omega/100,000 = 4*10^{-3}\Omega.$$

In the above description, an assumption is made that the voltage difference between the differential inputs of amplifier 21 is zero. It is commonly known in the art that such assumption is valid if the open loop gain of the amplifier is high. In general, however, the gain of the amplifier 21 required for an application will depend on the precision desired in that application, based upon the relation that the voltage $V'_{in}$ at the input of the integrator 23 is $V'_{in} = V_{in}*(A/(1+A))$.

It can be seen that with the present invention, the effective resistance experienced by the input signal due to the switch is significantly reduced.

Although the preferred embodiment is described with reference to a MOS amplifier 21, it will be understood by one skilled in the art that the invention can similarly be implemented with other semiconductor devices, such as a bipolar differential input amplifier. However, if amplifier 21 is a bipolar differential input amplifier, the current flowing into the inverting input of the amplifier may need to be accounted for because a voltage difference, equals to the product of this current and the resistance of switch 210, may result between the signal level experienced by the integrator 23 and the source signal, $V_{in}$.

Thus, the foregoing description of the preferred embodiment of the present invention has been presented for purposes of illustration and description. It is not intended to be exhaustive or to limit the invention to the precise form disclosed. Obviously, many modifications will be apparent to practitioners skilled in the art. The embodiment was chosen and described in order to best explain the principles of the invention and its practical application, thereby enabling others skilled in the art to understand the invention for various embodiments and with various modifications as asserted to the particular use contemplated. It is intended that scope of the invention be defined by the accompanying claims and their equivalents.

I claim:

1. A circuit for coupling and decoupling a source signal to a device, said circuit comprisisng:
    (a) a buffer including an amplifier having a first input, an second input and an output, said first input receiving the source signal and said output outputting a buffered source signal;
    (b) a main switch connected between said output of said amplifier and a node coupled to the input of the device, said main switch selectively coupling said buffered source signal to the device in response to a control signal;
    (c) means, coupled to said main switch and said buffer, for reducing the resistance of said main switch, said reducing means including a first switch and a second switch, said first switch connected between said output and said second input of said amplifier and said second switch connected between said node and said second input of said amplifier, and control means for providing said control signal to said main switch and said second switch and a complementary control signal to said first switch.

2. The circuit as in claim 1, wherein said amplifier is an operational amplifier.

3. The circuit as in claim 1, wherein each of said first and second switches is a field effect transistor transmission gate.

4. An electrical apparatus comprising:
    (a) signal processing means for processing a source signal; and
    (b) a circuit for coupling and decoupling said source signal to said signal processing means, said circuit including:
        (i) a buffer including a differential input amplifier having a noninverting input receiving the source signal, an inverting input, and a noninverted output outputting the source signal;
        (ii) a main switch having a first side connected to said noninverted output of said amplifier and a second side connected to the said signal processing means, said main switch selectively coupling the source signal to said signal processing means;
        (iii) means, coupled to said main switch and said buffer, for reducing the resistance of said main switch, said reducing means comprising a first switch and a second switch, said first switch being connected between the first side of said main switch and the inverting input of said amplifier, said second switch being connected between the second side of said main switch and the inverting input of said amplifier;
        (iv) control means for controlling the open an closed states of said main, first and second switches, said control means providing for said first switch to be open and said second switch to be closed when said main switch is closed, and said first switch to be closed and said second switch to be open when the main switch is open.

5. The apparatus as in claim 4 wherein said signal processing device is an integrator.

6. The apparatus as in claim 5, wherein said amplifier is an operational amplifier.

7. The circuit as in claim 4, wherein each of said first and second switches is a field effect transistor transmission gate.

8. A method for selectively coupling and decoupling a source signal and an integrator, comprising the steps of:
    (a) applying said source signal to a noninverting input of a differential input amplifier;
    (b) connecting a first side of an electrical switch to a noninverted output of said differential input amplifier and a second side of said electrical switch to said integrator;
    (c) connecting said first side of said electrical switch to an inverting input of said differential input amplifier when said electrical switch is open;
    (d) connecting said second side of said electrical switch to said inverting input of said differential input amplifier when said electrical switch is closed.

9. A circuit for selectively isolating an output device from transients in an input signal by selectively providing an output signal corresponding to the input signal, said circuit comprising:
    (a) an buffer having first and second inputs and an output, the input signal being coupled to at least one of said inputs;
    (b) a first switch coupled between said output and an output node, the conductive state of said first switch being enabled by a first control signal;
    (c) a second switch coupled between one of said first and second inputs and said output, the conductive state of said second switch being enabled by said first control signal;
    (d) a third switch coupled between said one of said first and second inputs and said output node, the conductive state of said third being enabled by a second control signal; and
    (e) control means for providing said first and second control signals such that the conductive states of said first and third switches are enabled complementary to the enabling of the conductive state of said second switch, said control means including timing means for selecting the period of time for enabling the conductive state of said second switch.

10. The circuit of claim 9 wherein said first, second and third switches have first, second and third enabled conductive resistances, respectively, and wherein the enabled conductive resistance of said second switch is greater than the sum of the enabled conductive resistances of said first and third switches.

11. The circuit of claim 10 wherein the operation of said timing means is correlated to the occurrence of transients in the input signal, whereby the output device is isolated from input signal transients as a consequence of the disabling of said first and third switches for the effective duration of the input signal transients.

* * * * *